United States Patent [19]

Papurt et al.

[11] Patent Number: 4,816,744

[45] Date of Patent: Mar. 28, 1989

[54] METHOD AND DEVICE FOR MEASURING INSIDE DIAMETERS USING A LASER INTERFEROMETER AND CAPACITANCE MEASUREMENTS

[75] Inventors: David M. Papurt, Chestnut Hill; David A. Cohen, Cambridge, both of Mass.

[73] Assignee: Laser Metric Systems, Inc., Cambridge, Mass.

[21] Appl. No.: 50,486

[22] Filed: May 18, 1987

[51] Int. Cl.$^4$ .................. G01R 27/26; G01B 11/14
[52] U.S. Cl. .................... 324/61 R; 324/61 P; 356/358; 33/707
[58] Field of Search ............ 324/61 R, 61 P; 340/870.37; 356/357, 358, 346; 33/125 A, 178 E, 542; 73/1 T

[56] References Cited

U.S. PATENT DOCUMENTS

| | | | |
|---|---|---|---|
| 2,573,824 | 11/1951 | Baker | 209/81 |
| 2,930,976 | 3/1960 | Hirdler | 324/61 R |
| 3,393,799 | 7/1968 | Schmersal | 209/73 |
| 3,421,079 | 1/1969 | Bennett et al. | 324/61 R |
| 3,520,613 | 7/1970 | Chitayat | 356/106 |
| 3,867,691 | 2/1975 | Plessis | 324/61 R |
| 4,038,890 | 8/1977 | Winget | 82/5 |
| 4,225,236 | 9/1980 | Sandercock | 356/346 |
| 4,295,092 | 10/1981 | Okamura | 324/61 R |
| 4,352,060 | 9/1982 | Garpendahl et al. | 324/61 R |
| 4,417,816 | 11/1983 | Kindl et al. | 356/357 |
| 4,560,924 | 12/1985 | Nordberg | 324/61 R |
| 4,643,577 | 2/1987 | Röth et al. | 356/358 |

Primary Examiner—Reinhard J. Eisenzopf
Assistant Examiner—Jack B. Harvey
Attorney, Agent, or Firm—Burns, Doane, Swecker and Mathis

[57] ABSTRACT

A method and device for measuring the distance between first and second positions on an inside surface of a metal part that includes locating a metal probe within the part, applying a voltage across the probe and part, measuring the capacitance between the probe and part, moving the probe toward the first position until a predetermined capacitance is measured, moving the probe toward the second position until the predetermined capacitance is measured, determining the distance travelled by the probe between the first and second positions, and adding to the determined distance a known value to compensate for the width of the probe and the distance between the probe and part when the predetermined capacitance is measured.

20 Claims, 4 Drawing Sheets

METHOD AND DEVICE FOR MEASURING INSIDE DIAMETERS USING A LASER INTERFEROMETER AND CAPACITANCE MEASUREMENTS

BACKGROUND OF THE INVENTION

1. Field of the Invention

The present invention relates to a method and device for measuring the inside diameter of a part, and more particularly to a method and device for measuring the inside diameter of a metallic part using a capacitive probe.

2. Description of Related Art

Inside diameter measuring systems have been known and used in the prior art. The more common systems include a probe that makes physical contact between the probe and the inside surface of the part that is being measured. These systems are known as contact gaging systems.

Contact gaging has a number of drawbacks, including wear on the contact surfaces of the probe, deformation or damage to the part being measured, sensitivity to contact force, and complex setup procedures.

One example of a contact gaging system is disclosed in U.S. Pat. No. 4,417,816, issued on Nov. 29, 1983 to Kindl et al. The disclosed device uses a gage head that contacts the part being measured, while a laser interferometer tracks movement of the gage head.

Other devices that include noncontact systems are known for measuring inside surfaces of hollow metal parts. For example, U.S. Pat. No. 4,352,060, issued on Sept. 28, 1982 to Garpendahl et al., discloses a measuring means that is mounted for axial movement within a hollow, elongated part. An electric circuit creates a capacitance between the measuring means and the part being measured and senses any variations in this capacitance as the measuring means is moved axially through the part. Variations of the inside diameter of the part can be determined by the sensed variations in the capacitance reading.

U.S. Pat. No. 4,295,092, issued on Oct. 13, 1981 to Okamura, discloses an apparatus for detecting corrosion damage in pipes comprising a cylinder upon which two disks are mounted in parallel. The disks carry electric charges that are opposite in polarity. As the cylinder is moved through a pipe, locations where the pipe has been corroded cause a capacitance reading between the disks to vary.

U.S. Pat. No. 3,867,691, issued on Feb. 18, 1975 to Plessis, discloses a capacitive probe for measuring the roundness of the inside surface of a cylinder. The probe is supported by air pressure and rotated within the cylinder.

However, none of the noncontact measuring devices discussed above appear to be intended for measuring the inside diameter of a cylindrical part. The devices disclosed above appear to be intended for measuring variations or abnormalities in a cylindrical surface, as opposed to the actual diameter of the cylinder.

OBJECTS AND SUMMARY OF THE INVENTION

In view of the foregoing limitations and shortcomings of the prior art devices, as well as other disadvantages not specifically mentioned above, it should be apparent that prior to the present invention there existed a need in the art for an efficient and accurate method and device for measuring the inside diameter of a part. It is therefore, a primary object of this invention to fulfill that need by providing such a method and device.

More particularly, it is an object of the present invention to provide a method and device that is capable of measuring the inside diameter of a part without actually touching the part.

It is another object of the present invention to provide a method and device that is capable of measuring the inside diameter of a part with extreme accuracy.

It is still another object of the present invention to provide a method and device for measuring the inside diameter of a part using a probe in such a way that the probe is not subject to wear or erosion.

Yet another object of the present invention is to provide a method and device for measuring the inside diameter of a wide variety of cylindrically symmetric parts, e.g., rings, ball bearing races, grooved cylinders etc.

Briefly described, these and other objects are accomplished according to the present invention by providing a method and device for measuring the distance between first and second positions on the inside surface of a metal part, said device including a metal probe, a device for creating and measuring a capacitance between the probe and the part, elements for moving the probe from the first position to the second position, and a device for measuring the distance travelled by the probe. In the present device, the probe does not need to touch the part, but moves toward the part until the capacitance reaches a predetermined level.

With the foregoing and other objects, advantages and features of the invention that will become hereinafter apparent, the nature of the invention may be more clearly understood by reference to the following detailed description, the appended claims and the several views illustrated in the attached drawings.

DETAILED DESCRIPTION

Figure 1:
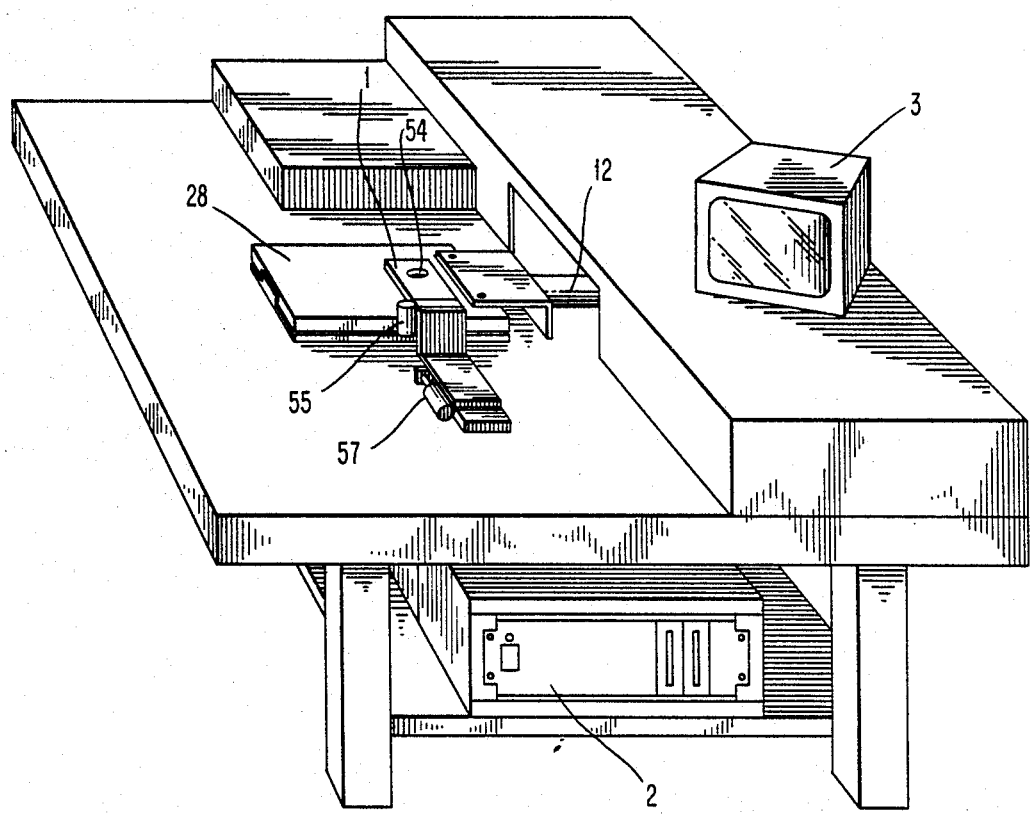
FIG. 1 is a perspective view illustrating an embodiment of the device according to the present invention.

Referring now in detail to the drawings, like parts are designated by like reference numerals throughout. The method and device of the present invention is designed to measure the inside diameter of a metallic part with a high degree of accuracy.

Referring to FIG. 1, the basic layout of the present invention includes a part holder 1 for holding a part to be measured, a linear slide 28 for manipulating a probe to measure the part, a heterodyne laser interferometer 12 for measuring movement of the linear slide 28, and a computer operating system 2 with an interface terminal 3.

Figure 2:
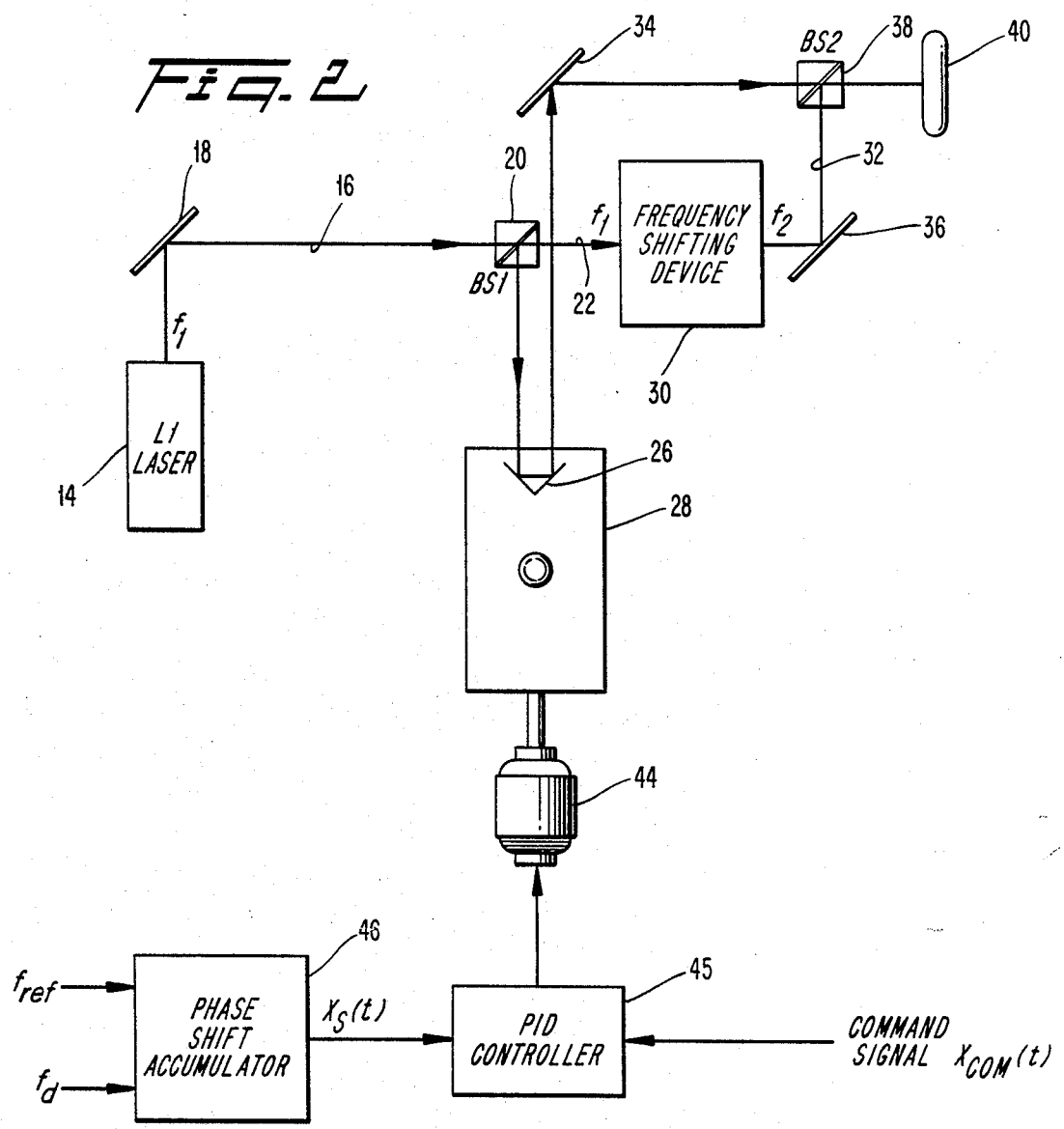
FIG. 2 is a schematic view of an embodiment of an interferometer that is used with the present invention.

Referring now to FIG. 2, the heterodyne laser interferometer 12 includes a single frequency stabilized laser generator 14 which emits a laser beam 16 having a single frequency $f_1$. The laser beam 16 is reflected by a mirror 18 and passes through a beam splitter 20. A first half (hereinafter the reference beam 22) of the beam 16 passes through the beam splitter 20, and a second half (hereinafter the slide beam 24) of the beam 16 is deflected to a cube corner retro-reflector 26 mounted on the linear slide 28.

The reference beam 22 passes from the beam splitter 20 to a frequency shifting device 30. Such frequency shifting devices are known to those skilled in the art, and may comprise a pair of acousto-optical modulators, such as the AOM-40 sold by Intra Action Corp. The frequency of the reference beam 22 is preferably shifted about one megahertz (MHz) from the frequency of the slide beam 24 to a frequency $f_2$. In actual operation, the frequency of the reference beam 22 is shifted up about 40 MHz and then down about 39 MHz for a net 1 MHz shift.

Double shifting is performed to achieve a net shift of one MHz due to the fact that acousto-optical modulators operating at about 40 MHz are much more efficient, less costly, and easier to design and install than units operating at one MHz.

Alternatively, instead of using a single frequency stabilized laser generator 14 and a frequency shifting device 30, a laser emitting a beam consisting of two orthogonally polarized waves of different frequency may be used. In such a case, the waves are separated using polarization sensitive optics (e.g., quarter/half wave plates, polarizing beam splitters, Brewster angle optics, etc.). One of the waves serves as the reference beam, the other as the slide beam.

In the embodiment using the single frequency stabilized laser generator 14 and the frequency shifting device 30, the frequency shifted reference beam 22 and the slide beam 24 are guided by respective mirrors 36,34 onto a second beam splitter 38 and then mixed onto an optical detector 40, such as an SD-041 series made by Silicon Detector Corp.

The optical detector 40 detects the difference in the frequencies of the frequency shifted reference beam 22 and the slide beam 24. When the linear slide 28 and reflector 26 are stationary, the frequency shift imparted by the frequency shifting device 30 will be detected. When the linear slide 28 and reflector 26 are moving, the slide beam 24 will be phase advanced (or retarded) such that for every half wavelength of linear slide 28 motion, the phase of the slide beam 24 will undergo either one additional cycle or one less cycle, depending on the direction of the linear slide 28 motion.

To detect the phase shifts caused by movement of the linear slide 28, an electrical reference frequency $f_{ref}$ is defined as the different in frequency ($f_d$) between the slide beam 24 and the frequency shifted reference beam 22 when the slide 28 is stationary. During operation of the linear slide 28, $f_d$ varies with movement of the linear slide 28.

In a given time interval of operation, the difference between $f_d$ and $f_{ref}$ is recorded by a phase shift accumulator 46. This difference represents the change in the position of the linear slide 28 during this time interval. Positive differences represent movement of the linear slide 28 toward the beam splitter 20, while negative differences represent movement of the linear slide 28 away from the beam splitter 20.

Figure 3:
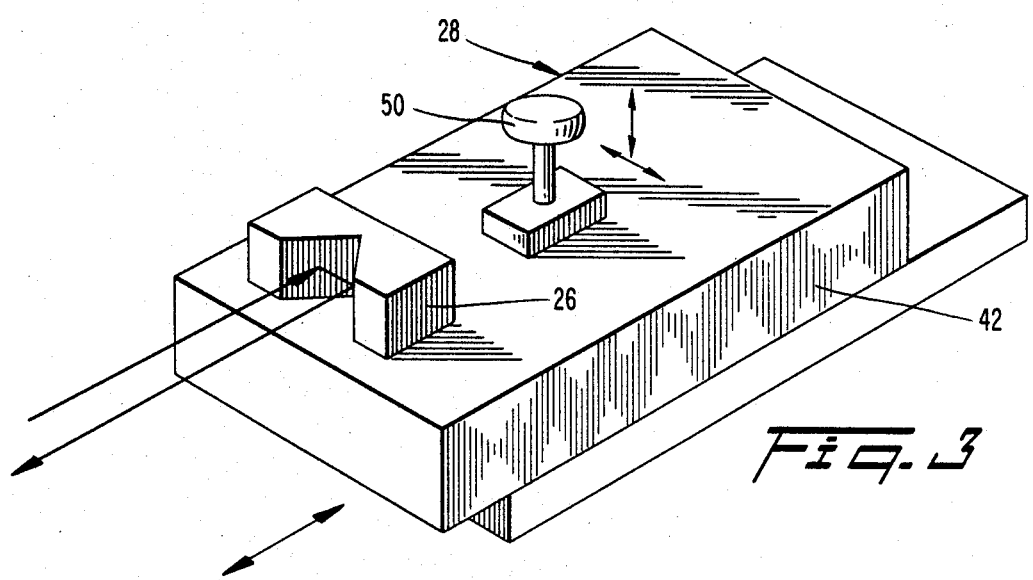
FIG. 3 is a perspective view of an embodiment of a linear slide used in the system of the present invention.

With reference now to FIGS. 2 and 3, the linear slide 28 comprises a precision ball slide, which is driven in a straight line along a track by a linear motor 44. The linear motor 44 and thus the linear slide 28 are controlled by a Proportional Integral Differential (P.I.D.) controller 45.

A PID controller is a feedback system capable of controlling the movements of mechanical elements through the use of an actuator such as a linear motor and position sensors such as the heterodyne interferometer discussed above. The P.I.D. controller 45 receives command signals $x_{com}(t)$ from the computer operating system 2 and from an electronic phase shift accumulator 46 which receives the signals $f_{ref}$ and $f_d$ from the optical detector 40. The accumulator's 46 output corresponds to the position of the slide 28 relative to a starting point. The starting point is the position of the slide 28 when the accumulator is activated prior to operation of the interferometer.

With reference to FIG. 3, a metal capacitance probe 50 comprises a precision machined metal part, somewhat spherical in shape. The outer curved surface of the probe is honed and lapped to a fine (2 microinch) finish. The surface of the probe 50 constitutes one "plate" of a capacitor. The other "plate" is the part 52 to be measured. The probe 50 preferably has a diameter of about 0.25 inches and an edge radius of 0.02 inches.

Figure 4:
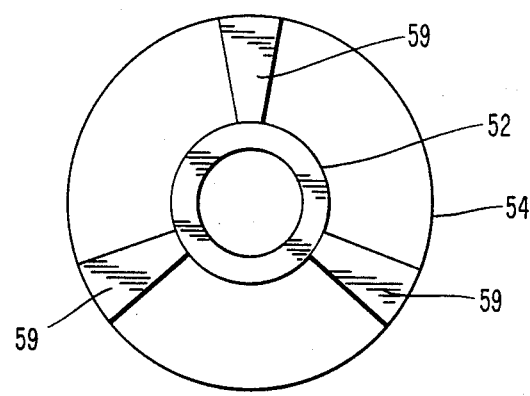
FIG. 4 is a top plan view of an embodiment of a part holder according to the present invention.

With reference to FIGS. 1 and 4, the part 52 is located at a height about three inches above the surface of the linear slide 28 by means of a holding fixture 54. The part holding fixture 54 is vertically adjustable by means of a first micrometer drive motor 55. The part holding fixture 54 is adjustable in a horizontal direction, transverse to the direction in which the linear slide 28 travels, by means of a second micrometer drive motor 57. The first and second drive motors 55,57 are controlled by the computer operating system 2. The part 52 to be measured is gripped in the part holding fixture 54 by three arms 59. The arms 59 are preferably not movable, but have surfaces 61 that form a slightly tapered opening into which the part 52 fits.

Figure 5:
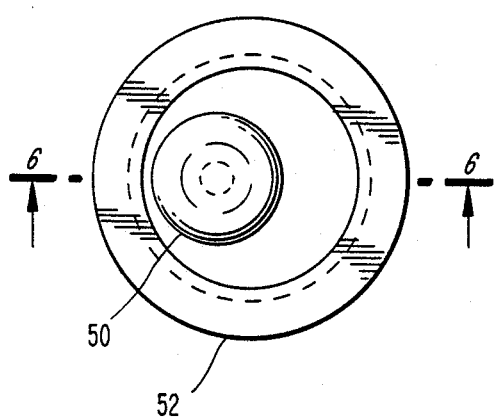
FIG. 5 is a top plan view of an embodiment of a part being measured and measuring probe according to the present invention.
Figure 6:
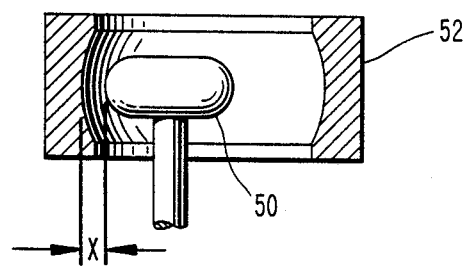
FIG. 6 is a view in cross section taken along line 6—6 of FIG. 5.

To measure the inside diameter of the part 52, the part 52 is mounted on the part holding fixture 54. With reference to FIGS. 5 and 6, the general location of the part holding fixture 54 is preset according to the approximate size and shape of the part 52 such that when the part 52 is mounted in the part holding fixture 54, the probe 50 extends into the center of the part 52. The probe 50 is then moved by the linear slide 28 to a location approximately 0.002 of an inch from the inside surface of the part 52. A capacitance change of about 1 to 3 picofarads ($_pF$) can be sened when moving the probe 50 from the center of the part 52 to 0.002 inch from the part surface.

Figure 7:
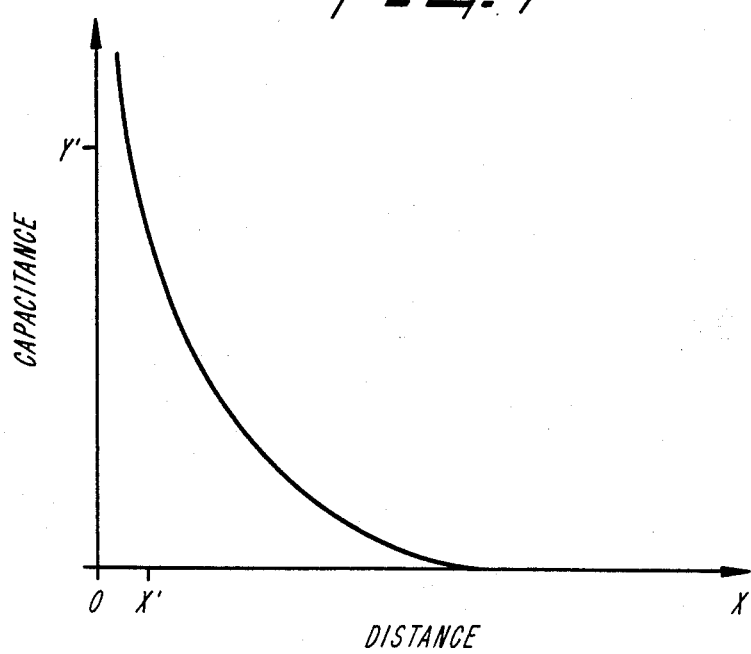
FIG. 7 is a graph of a capacitance signal.

By applying a sine wave voltage of preferably 1 volt (peak), 100 KHz to the part 52, and sensing the displacement current flowing back through the probe 50, the electrical capacitance of the probe-part configuration can be measured. With reference to FIG. 7, the capacitance y is a function of the distance x between the part 52 and the probe 50.

Prior to taking a detailed measurement, the part 52 is first "centrated" with respect to the probe 50. "Centrating" involves centering the part 52 with respect to the probe 50 along the vertical axis and along the axis transverse to the direction of slide 28 motion. The part 52 is centered vertically with respect to the probe 50 by means of the drive motor 55. The part is centered with respect to the direction transverse to the direction of slide 28 travel by means of drive motor 57. This two dimensional centering of the part 52 is determined by relative capacitance of the probe-part configuration. The part 52 is considered centrated when the capacitance is at a minimum.

The centrating process may be reiterative, with the part 52 being repeatedly adjusted by the linear slide 28 between finer adjustments with the drive motors 55,57. After each centrating cycle is performed, the probe 50 may be moved closer to the part 52 and the process repeated. This allows the probe 50 to achieve a very intimate fit with the part 52 and approach very close to the part surface (a few hundred microinches). This procedure can be used to enhance the accuracy of the inside diameter measurement.

Alternatively, the centrating process can be achieved by holding the part 52 fixed and moving the probe 50 vertically and transverse to slide motion. To achieve high speed operation the probe may be mounted on a pair of piezo-electric linear actuators. With reference to FIG. 3, the piezo-electric actuators 27 are mounted on the linear slide 28. However, it is not necessary for one embodiment to have both the drive motors 55,57 and the piezo-electric actuators 27.

When the probe 50 approaches within 40 microinches of the part 52, the air in the space between them will begin to ionize due to voltage breakdown, and non-capacitive current will begin to flow. The onset of voltage breakdown can be seen by monitoring the phase of the current relative to the sine wave voltage. The phase is 90 degrees for the capacitive component, and is closer to zero for the breakdown component, which functions like a resistor. In addition, the breakdown component is unstable in amplitude and phase, and provides unreliable data.

After the part 52 has been centrated with respect to the probe 50 along the two dimensions discussed above, the linear slide 28 moves the probe 50 toward one inside surface of the part 52 until the capacitance reaches a predetermined level y', preferably about 2 $_pF$ greater than the capacitance when the probe is far from the ring surface such as about 0.010 inches. When the capacitance level reaches y', the probe 50 may be approximately 200 to 300 micro inches away from the part surface.

In order to compensate for "parasitic" capacitances, i.e., capacitances associated with the fixture 54 and other metallic parts electrically connected to the part 52, the capacitance values are read as relative values. In other words the capacitance is actually read as the difference in capacitance as the probe 50 moves within the part 52. Through prior calibration with a part 52 of a known diameter, it is known that when the capacitance reaches the predetermined level y' the probe 50 is a known distance x' from the part 52.

When the probe 50 is at the distance x' from the part 52, the interferometer 12 is activated and the probe 50 is then moved diametrically across the interior of the part 52 by means of the linear slide 28. As the probe 50 approaches the opposite side of the part 52, the capacitance increases. The operating system 2 stops the linear slide 28 and the probe 50 when the capacitance again reaches the predetermined level y'. At that point, it is known that the probe 50 is a distance x' from the part 52. The distance travelled by the probe is calculated by the interferometer 12. The actual diameter of the part 52 can then be determined by the formula: diameter=2x'+width of probe (a known value)+distance travelled by the probe. Using such a method, measurements to within ±0.00001 of an inch can be determined.

In an alternative method, instead of calibrating with a part of known diameter, the relationship between the capacitance and the distance between the probe 50 and part 52 can be determined by mathematical formulas attributed to known characteristics of the part 52.

The method and device described herein can be further automated by means of the computer operating system 2.

In such an embodiment, the computer 2 may initialize the system by centering the probe 50 with respect to the part fixture 54 in order to receive a part 52.

The part 52 is then placed in the fixture 54 and nominal data approximating the dimensions of the part 52 is entered into the computer 2. Based upon such nominal data, the computer 2 controls the linear motor 44 to move the probe 50 from one side of the part 52 to the other in order to verify the nominal data fed into the computer. The computer 2 then controls the drive motors 55,57 to approximately centrate the probe 50 with respect to the part 52, based in part upon the capacitance signals measured during the centrating process.

Figure 8:
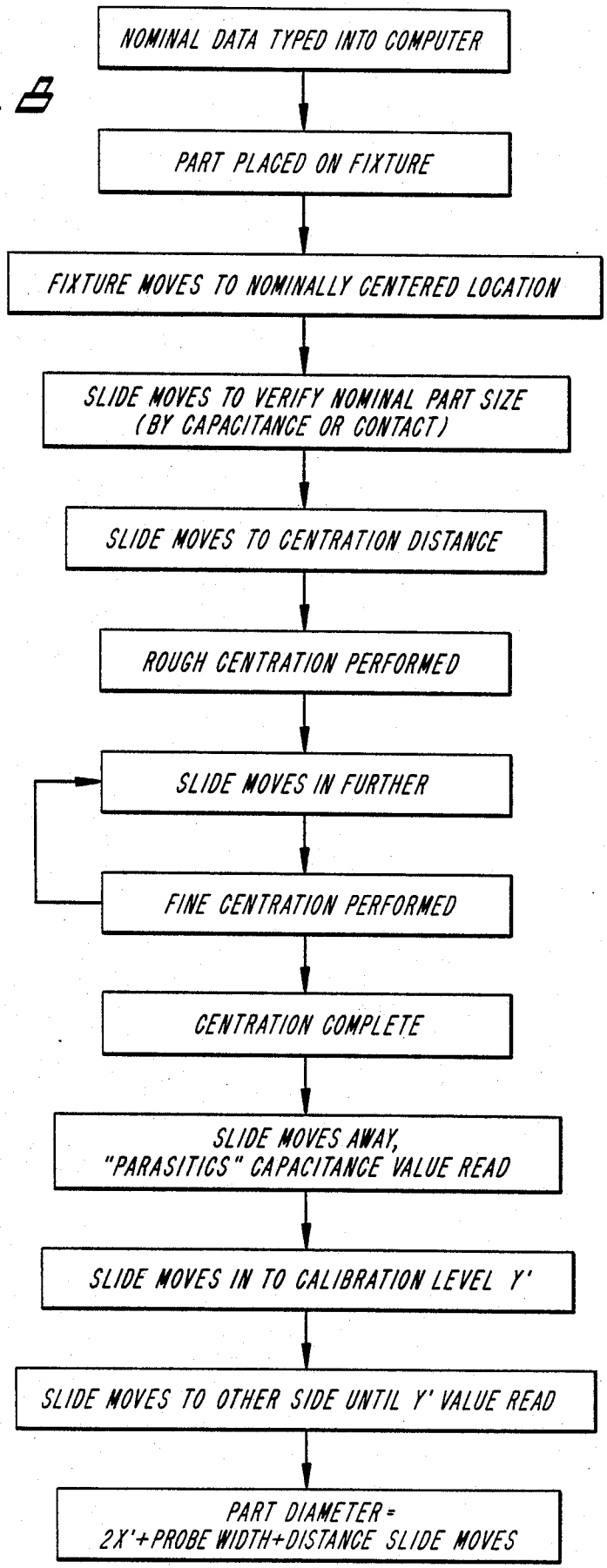
FIG. 8 is a flowchart for operation according to the present invention.

Once the probe 50 is centrated with respect to the part 52, the actual detailed measurement of the part 52 proceeds as set forth above. The means for applying a voltage, determining the capacitance and compensating for probe width are included in computer 2. With reference to FIG. 8, a flowchart for the operation of the present invention is provided.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A method for measuring the distance between first and second positions on an inside surface of a metal part, comprising the steps of:
    locating a metal probe within the part;
    applying a voltage across the probe and part;
    measuring the capacitance between the probe and part;
    moving the probe toward the first position until a predetermined capacitance is measured;
    moving the probe toward the second position until the predetermined capacitance is measured;
    determining the distance travelled by the probe between the first and second positions; and
    adding to the determined distance a known value to compensate for the width of the probe and the distance between the probe and part when the predetermined capacitance is measured.

2. The method of claim 1, further comprising the step of adjusting the part with respect to the probe in order to center the part with respect to the probe prior to the step of moving the probe.

3. The method of claim 2, wherein the adjusting step includes moving the part vertically with respect to the probe.

4. The method of claim 2, wherein the adjusting step includes moving the part in a direction transverse to the direction that the probe moves.

5. The method of claim 2, wherein the adjusting step includes moving the probe vertically with respect to the part.

6. The method of claim 2, wherein the adjusting step includes moving the probe in a direction transverse to the direction that the probe moves when moving toward the first position.

7. The method of claim 1, wherein the determining step includes measuring the distance travelled with a laser interferometer.

8. The method of claim 1, wherein the step of measuring the capacitance includes measuring the change in capacitance as the probe moves within the part.

9. A device for measuring the inside diameter of an opening in a metal part, comprising:
   means for holding the metal parts;
   a probe;
   means for holding the probe within the opening;
   means for applying a voltage across the probe and the metal part,
   means for determining the capacitance between the probe and the metal part;
   means for moving the probe toward a first side of the opening until a predetermned capacitance is determined and then moving the probe away from the first side toward a second side of the opening until the predetermined capacitance is again determined; and means for determining the distance that the probe travelled while moving from the first side.

10. The device of claim 9, wherein the means for moving the probe includes a precision ball slide.

11. The device of claim 9, further comprising means for adjusting the part with respect to the probe in order to center the part with respect to the probe.

12. The device of claim 11, wherein the adjusting means includes drive motors for moving the part vertically and in a direction transverse to the direction in which the probe moves.

13. The device of claim 9, wherein the distance determining means includes a laser interferometer.

14. The device of claim 9, further including means for adding to the determined distance a known value to compensate for the width of the probe and the distance between the probe and part when the predetermined capacitance is measured.

15. A method for measuring the inside diameter of an opening in a metal part, comprising the steps of:
   locating a metal probe within the opening;
   applying a voltage across the probe and part;
   measuring the capacitance between the probe and part;
   moving the probe toward a first side of the opening until a predetermined capacitance is measured;
   moving the probe in a straight line toward a second side of the opening until the same predetermined capacitance is measured;
   determining the distance travelled by the probe between the first and second sides; and
   adding to the determined distance a known value to compensate for the width of the probe and the distance between the probe and the opening sides when the predetermined capacitance is measured.

16. The method of claim 15, further comprising the step of adjusting the part with respect to the probe in order to center the part with respect to the probe prior to the step of moving the probe.

17. The method of claim 16, wherein the adjusting step includes moving the part vertically with respect to the probe.

18. The method of claim 16, wherein the adjusting step includes moving the part in a direction transverse to the direction in which the probe moves.

19. The method of claim 16, wherein the adjusting step includes moving the probe vertically with respect to the part.

20. The method of claim 16, wherein the adjusting step includes moving the probe in a direction transverse to the direction that the probe moves when moving toward the first position.

* * * * *